(12) United States Patent
Heo (10) Patent No.: US 8,823,425 B2
(45) Date of Patent: Sep. 2, 2014

(54) OUTPUT DRIVING CIRCUIT AND TRANSISTOR OUTPUT CIRCUIT

(75) Inventor: Chang Jae Heo, Gyeonggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 37 days.

(21) Appl. No.: 13/569,094

(22) Filed: Aug. 7, 2012

(65) Prior Publication Data

US 2013/0038356 A1   Feb. 14, 2013

(30) Foreign Application Priority Data

Aug. 9, 2011   (KR) .......................... 10-2011-0079171

(51) Int. Cl.
    *H03B 1/00* (2006.01)
(52) U.S. Cl.
    USPC ............ 327/112; 327/108; 327/333; 327/391
(58) Field of Classification Search
    USPC ............ 327/108, 112, 333, 389, 391; 326/26, 326/27, 68, 80–83
    See application file for complete search history.

(56) References Cited

U.S. PATENT DOCUMENTS

| 7,145,364 B2* | 12/2006 | Bhattacharya et al. ......... 326/68 |
| 2011/0037745 A1 | 2/2011 | Takasugi |
| 2012/0075001 A1* | 3/2012 | Sumitomo .................... 327/333 |

FOREIGN PATENT DOCUMENTS

| JP | 2000-353947 A | 12/2000 |
| JP | 2002-190731 A | 7/2002 |
| JP | 2006-033972 A | 2/2006 |
| JP | 2009-147515 A | 7/2009 |
| KR | 10-2000-0074468 A | 12/2000 |

* cited by examiner

*Primary Examiner* — Long Nguyen
(74) *Attorney, Agent, or Firm* — Bracewell & Giuliani LLP; Brad Y. Chin (57) ABSTRACT

Disclosed herein are an output driving circuit and a transistor output circuit. The output driving circuit includes: a reference voltage generating unit generating a reference voltage; a level shift unit including a transistor latch and turning off a first transistor of a driving circuit or driving the first transistor; a driving circuit unit including the first transistor that is driven to apply power to a gate of an output transistor and a second transistor that is driven complementarily to the first transistor to lower a gate voltage of the output transistor and drive the output transistor; and an withstand voltage protecting unit that is driven by receiving a reference voltage and includes a first withstand voltage protecting unit for protecting transistors of the transistor latch and the first transistor for stable operations thereof and a second withstand voltage protecting unit for protecting the output transistor for a stable operation thereof.

16 Claims, 4 Drawing Sheets

- PRIOR ART -

OUTPUT DRIVING CIRCUIT AND TRANSISTOR OUTPUT CIRCUIT

CROSS REFERENCE(S) TO RELATED APPLICATIONS

This application claims the benefit under 35 U.S.C. Section 119 of Korean Patent Application Serial No. 10-2011-0079171, entitled "Output Driving Circuit and Transistor Output Circuit" filed on Aug. 9, 2011, which is hereby incorporated by reference in its entirety into this application.

BACKGROUND OF THE INVENTION

1. Technical Field

The present invention relates to an output driving circuit and a transistor output circuit, and more particularly, to an output driving circuit and a transistor output circuit that stably operate when a high voltage that is smaller than a source-drain breakdown voltage and is greater than a gate-source breakdown voltage is applied to a gate of an output transistor.

2. Description of the Related Art

An operating voltage of a P-channel transistor, for example a P-channel LDMOS is determined according to a source-drain breakdown voltage BVsd, a source-gate breakdown voltage BVsg, and a gate-drain breakdown voltage BVgd. From among these breakdown voltages, the source-gate breakdown voltage BVsg is the lowest. The source-gate breakdown voltage BVsg is determined according to a thickness of a gate oxide. This is because the gate oxide may not be formed to have an excessive large thickness since a threshold voltage Vth of a transistor, a source-drain current Isd, on-resistance Ron, and the like are determined according to a thickness of an oxide. If a power voltage is lower than the source-drain breakdown voltage BVsd and is higher than the source-gate breakdown voltage BVsg, when the power voltage is applied to a source terminal and a low voltage (ground, etc.) is connected to a drain terminal, no problem arises. However, if the power voltage and the low voltage (ground) are applied to a gate terminal in order to operate a transistor, the power voltage is applied to a source-gate voltage Vsg. In this case, since the power voltage is greater than the source-gate breakdown voltage BVsg, the transistor device may breakdown.

Figure 5:
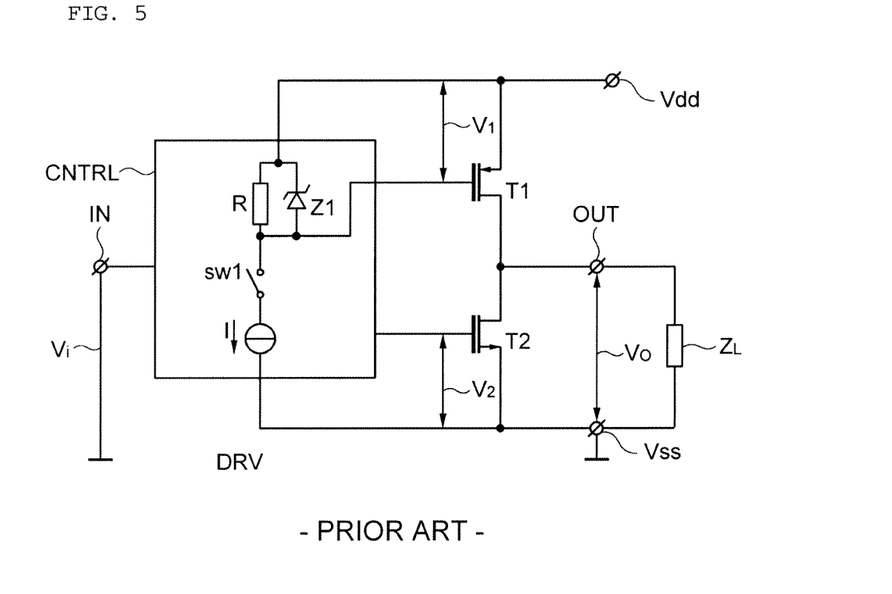
FIG. 5 is a schematic circuit diagram of a conventional output driving circuit.

FIG. 5 is a schematic circuit diagram of a conventional output driving circuit.

Referring to FIG. 5, when a switch SW1 is switched off in order to turn on an output transistor T1, if a current I flows through a power voltage VDD, a resistor R connected to a gate of the output transistor T1, and a Zener diode Z1, the output transistor T1 is driven by lowering a source-gate voltage of the output transistor T1 compared to the source-gate breakdown voltage BVsg and increasing the source-gate voltage compared to a threshold voltage Vth by using the Zener diode Z1. On the other hand, the output transistor T1 is turned off by switching on the switch SW1 and increasing a gate voltage of the output transistor T1 up to the power voltage VDD by using the resistor R connected to the power voltage VDD and the gate of the output transistor T1.

In order to operate the output transistor T1 at a relatively high frequency, a current mirror instead of the resistor R may be used to turn off the output transistor T1, unlike in FIG. 5.

SUMMARY OF THE INVENTION

Conventionally, referring to FIG. 5, since a gate-source capacitor of an output transistor T1 is charged by using a resistor R and is discharged through a current source, it is difficult to operate the output transistor T1 at a relatively high frequency. In addition, since a current I continually flows through the resistor R and the Zener diode Z1 in order to maintain an on-state of the output transistor T1, the amount of current consumed is high.

In order to operate the output transistor T1 at a relatively high frequency, when a current mirror is used to turn off the output transistor T1, a high current mirror rate is required to charge the gate-source capacitance of the output transistor T1 at high speed and a high current I is required to discharge the gate-source capacitance of the output transistor T1 at high speed, like in FIG. 5. In addition, in this case, since a high current I continually flows through the Zener diode Z1 in order to maintain an on-state of the output transistor T1, the amount of current consumed is high, like in FIG. 5.

To overcome this problem, an object of the present invention is to provide an output driving circuit and a transistor output circuit, which may include a level shift unit and may stably operate when a high voltage that is smaller than a source-drain breakdown voltage and is greater than a gate-source breakdown voltage is applied to a gate of the output transistor.

Another object of the present invention is to provide an output driving circuit and a transistor output circuit, which may include a level shift unit for stably operating an output transistor at a high frequency and for stably operating an output transistor at a low amount of current consumed.

According to an exemplary embodiment of the present invention, there is provided an output driving circuit including: a reference voltage generating unit for generating a reference voltage having a predetermined voltage difference with respect to a high voltage power source; a level shift unit including a transistor latch and turning off a first transistor of a driving circuit by applying the high voltage power to the first transistor according to an input of an input terminal or driving the first transistor by lowering a gate voltage of the first transistor according to an input of an input terminal; a driving circuit unit including the first transistor that is driven according to a control of the level shift unit to apply the high voltage power to a gate of an output transistor and a second transistor that is driven complementarily to the first transistor to lower a gate voltage of the output transistor and drive the output transistor; and an withstand voltage protecting unit that is driven by receiving a reference voltage generated from the reference voltage generating unit and includes a first withstand voltage protecting unit for protecting transistors of the transistor latch and the first transistor for stable operations thereof and a second withstand voltage protecting unit for protecting the output transistor for a stable operation thereof.

The level shift unit may include: a first inverter for inverting the input of the input terminal; the transistor latch including third and fourth transistors that are P-channel transistors each having a source electrode connected to the high voltage power source, a gate of the fourth transistor being connected to a drain of the third transistor and a gate of the third transistor being connected to a drain of the fourth transistor and a gate of the first transistor; an N-channel fifth transistor that is driven according to the input of the input terminal and lowers a gate voltage of the fourth transistor; and an N-channel sixth transistor that is driven according to an input corresponding to an inverting output of the first inverter and drives the first transistor by lowering the gate voltage of the first transistor.

The driving circuit unit may include a second inverter for receiving and inverting an output of the first inverter; a P-channel first transistor that is driven by a gate voltage's lowering according to driving of the sixth transistor and turns off the output transistor by applying the high voltage power source connected to a source electrode to the gate of the output transistor; and an N-channel second transistor that is driven complementarily to the first transistor by receiving an output of the second inverter and pulls the gate voltage of the output transistor down to a low voltage power source to lower the gate voltage of the output transistor.

The first withstand voltage protecting unit may include a P-channel seventh transistor that is driven by receiving the reference voltage and pulls a gate voltage of the fourth transistor connected to a source electrode down to the fifth transistor connected to a drain electrode to lower the gate voltage of the fourth transistor; and a P-channel eighth transistor that is driven by receiving the reference voltage and pulls gate voltages of the first and third transistors connected to a source electrode down to the sixth transistor connected to a drain electrode to lower the gate voltages of the first and third transistors. In addition, the second withstand voltage protecting unit may include a P-channel ninth transistor that is driven by receiving the reference voltage and may pull the gate voltage of the output transistor connected to a source electrode down to the second transistor connected to a drain electrode to lower the gate voltage of the output transistor.

The reference voltage generating unit may include a Zener diode connected to the high voltage power source.

The reference voltage generating unit may include a plurality of P-channel MOSFETs that are connected in series to the high voltage power source.

The reference voltage generating unit may include a plurality of N-channel MOSFETs that are connected in series to the high voltage power source.

The output transistor may be a P-channel MOSFET or a P-channel LDMOS transistor that is driven by driving of the second transistor of the driving circuit unit to output high voltage power.

According to another exemplary embodiment of the present invention, there is provided a transistor output circuit including: a P-channel output transistor having a source electrode connected to the high voltage power source and outputting high voltage power through a drain electrode; an N-channel output transistor that operates complementarily to the P-channel output transistor and pulls power from a drain electrode connected to the drain electrode of the P-channel output transistor down to a lower voltage power source connected to a source electrode; and the output driving circuit as described above, for driving each of the P-channel and N-channel output transistors according to a complementary switching operation.

The P-channel output transistor may be driven by driving of the second transistor, and the N-channel output transistor may be driven according to a complementary input to an input of the input terminal for driving the second transistor.

DESCRIPTION OF THE PREFERRED EMBODIMENTS

Exemplary embodiments of the present invention for accomplishing the above-mentioned objects will be described with reference to the accompanying drawings. In describing exemplary embodiments of the present invention, the same reference numerals will be used to describe the same components and an additional description that is overlapped or allow the meaning of the present invention to be restrictively interpreted will be omitted.

It will be understood that when an element is simply referred to as being 'connected to' or 'coupled to' another element without being 'directly connected to' or 'directly coupled to' another element in the present description, it may be 'directly connected to' or 'directly coupled to' another element or be connected to or coupled to another element, having the other element intervening therebetween.

Although a singular form is used in the present description, it may include a plural form as long as it is opposite to the concept of the present invention and is not contradictory in view of interpretation or is used as clearly different meaning.

It should be understood that "include", "have", "comprise", "be configured to include", and the like, used in the present description do not exclude presence or addition of one or more other characteristic, component, or a combination thereof.

Hereinafter, an output driving circuit will be described with regard to exemplary embodiments of the invention with reference to the attached drawings.

Figure 1:
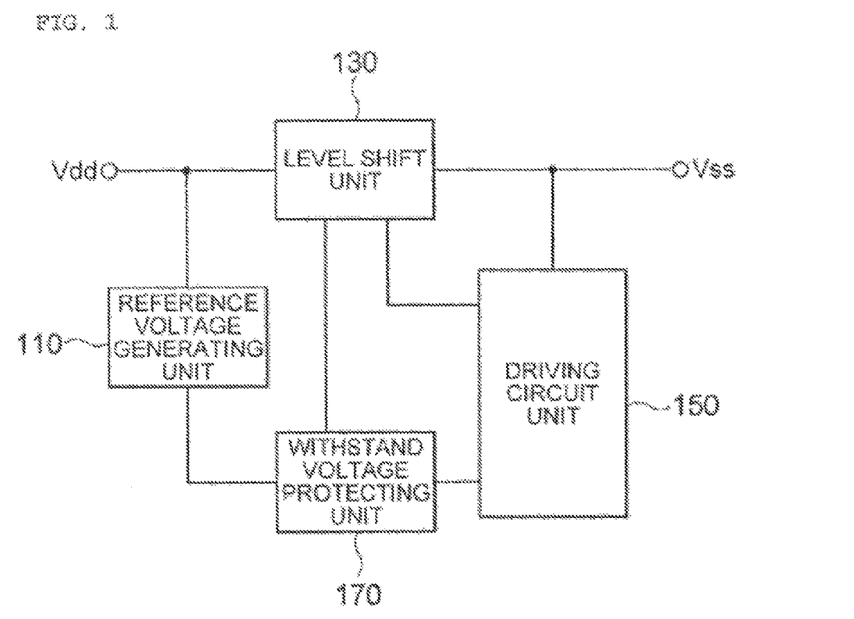
FIG. 1 is a schematic block diagram of an output driving circuit according to an embodiment of the present invention.
Figure 2A:
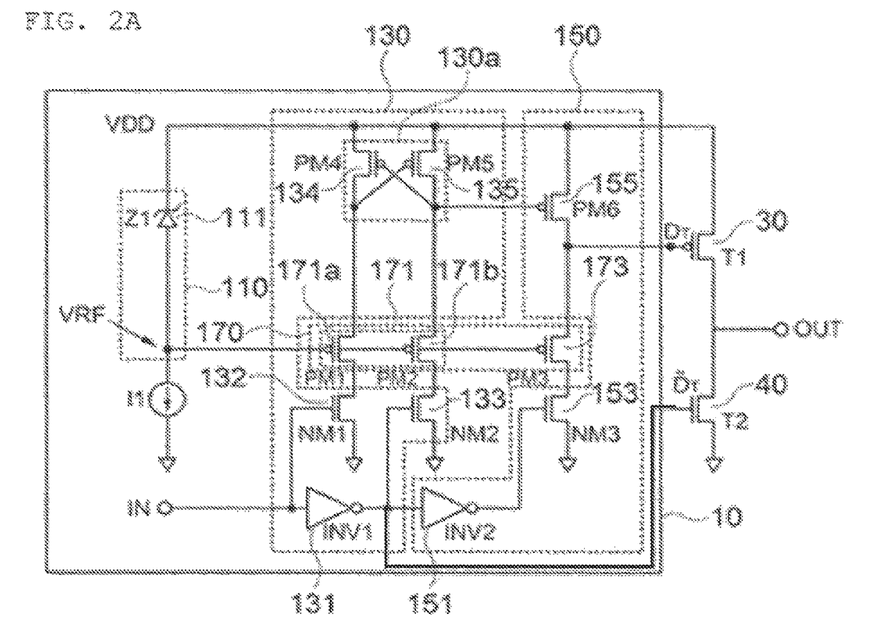
FIGS. 2A through 2C are circuit diagrams of a transistor output circuit including an output driving circuit according to an embodiment of the present invention.
Figure 2B:
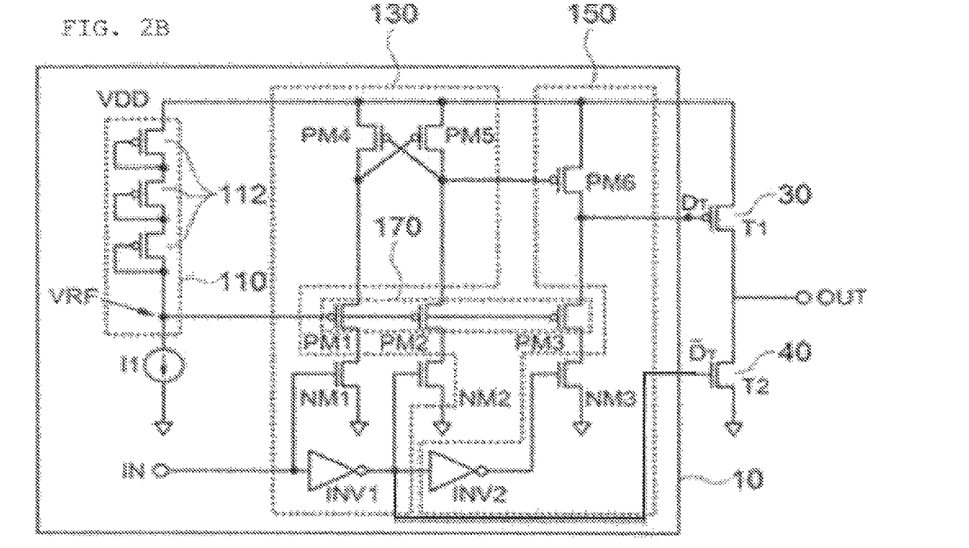
Figure 2C:
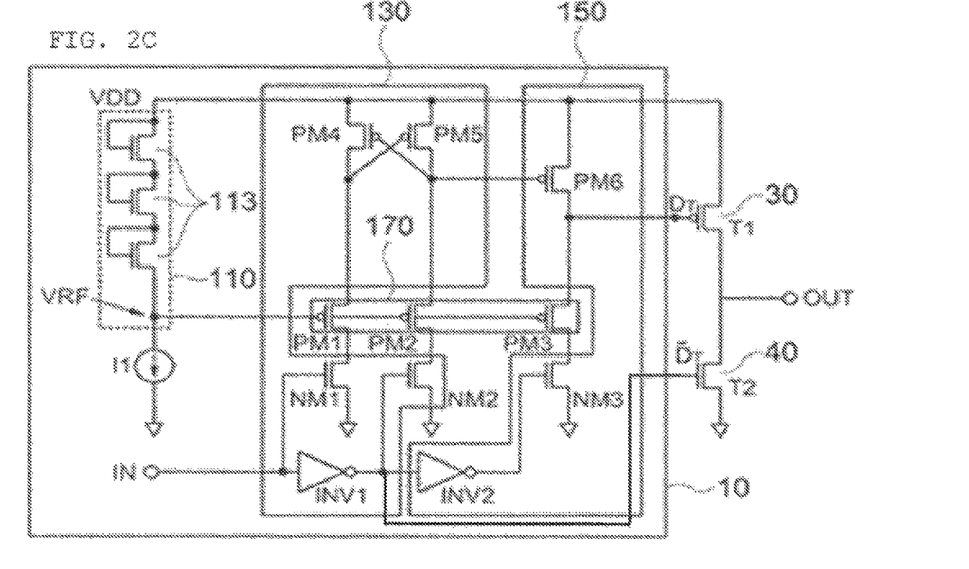
Figure 3:
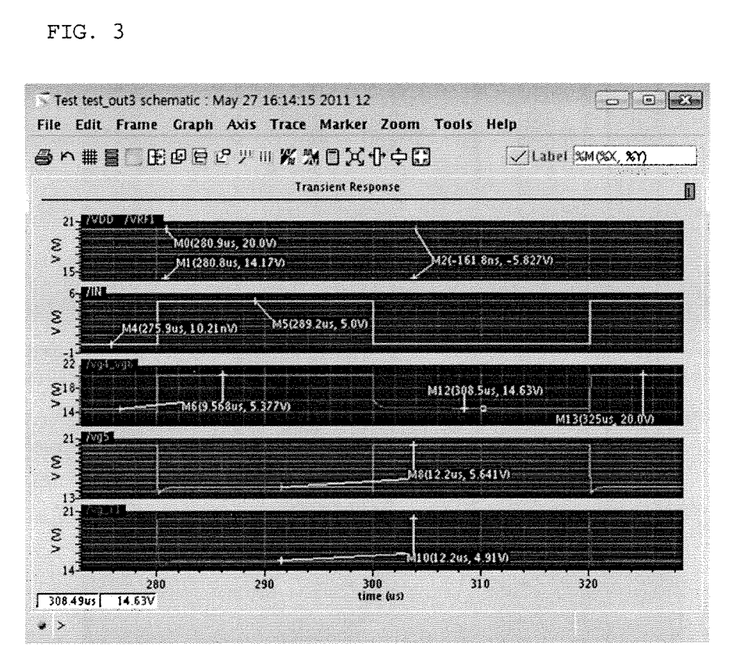
FIG. 3 is a graph showing a simulation result of an output driving circuit according to an embodiment of the present invention.
Figure 4:
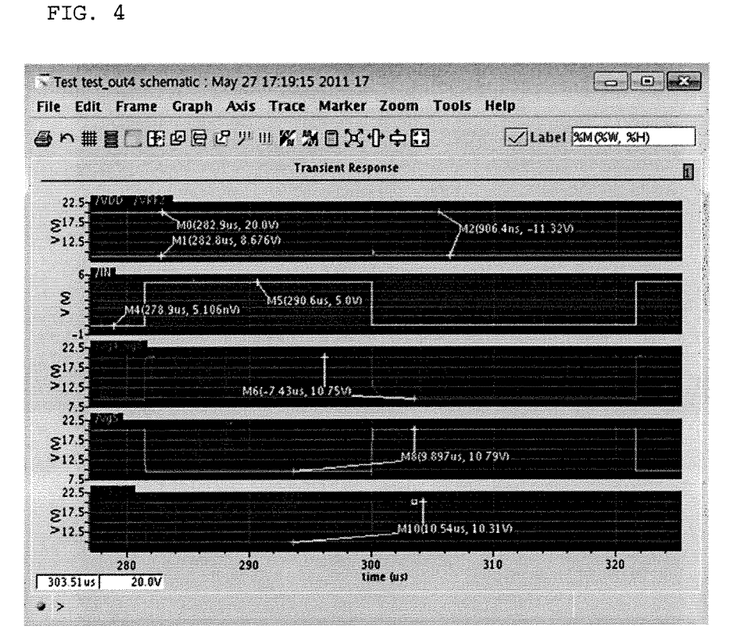
FIG. 4 is a graph showing a simulation result of an output driving circuit according to another embodiment of the present invention.

FIG. 1 is a schematic block diagram of an output driving circuit according to an embodiment of the present invention. FIGS. 2A through 2C are circuit diagrams of a transistor output circuit including an output driving circuit 10 according to an embodiment of the present invention. FIG. 3 is a graph showing a simulation result of an output driving circuit according to an embodiment of the present invention. FIG. 4 is a graph showing a simulation result of an output driving circuit according to another embodiment of the present invention.

The output driving circuit 10 will be described with reference to FIGS. 1, 2A, 2B and/or 2C. Referring to FIGS. 1, 2A, 2B, and/or 2C, the output driving circuit 10 includes a reference voltage generating unit 110, a level shift unit 130, a driving circuit unit 150, and an withstand voltage protecting unit 170.

In detail, the reference voltage generating unit 110 generates a reference voltage VRF having a predetermined voltage difference with respect to a high voltage power source VDD. According to the present embodiment, the reference voltage VRF is a driving voltage for driving the level shift unit 130, the driving circuit unit 150, and the withstand voltage protecting unit 170 for protecting a transistor in an output transistor and is lower than the high voltage power VDD.

Referring to FIGS. 2A, 2B and/or 2C, as an example, a difference between the high voltage power VDD and the reference voltage VRF is smaller than a source-gate breakdown voltage BVsg of a P-channel transistor included in a transistor latch 130a of the level shift unit 130, for example, a third transistor PM4 134, a fourth transistor PM5 135, a first P-channel transistor PM6 155 of the driving circuit unit 150, and a P-channel output transistor T1 30, and falls within a range of a recommended operating source-gate voltage of these P-channel transistors, for example, PMOS transistors.

Referring to FIG. 2A, according to an embodiment of the present invention, the reference voltage generating unit 110 includes a Zener diode Z1 111 connected to high voltage power VDD. A voltage between high voltage power VDD and the reference voltage VRF is maintained constant by the Zener diode Z1 111.

Referring to FIG. 2B, according to another embodiment of the present invention, the reference voltage generating unit 110 includes a plurality of P-channel MOSFETs 112 that are connected in series to the high voltage power source. Referring to FIG. 2C, according to another embodiment of the present invention, the reference voltage generating unit 110 includes a plurality of N-channel MOSFETs 113 that are connected in series to the high voltage power source. In this case, in FIGS. 2B and 2C, a gate and a source of a PMOS transistor or a NMOS transistor that are used instead of the Zener diode Z1 111 may be connected to the high voltage power source and a diode may be connected between a source and a drain.

The level shift unit 130 will be described with reference to FIGS. 1, 2A, 2B, and/or 2C. The level shift unit 130 includes the transistor latch 130a. Referring to FIGS. 2A, 2B, and/or 2C, the level shift unit 130 converts an input signal of a ground reference of the first P-channel transistor PM6 155 into a control signal of a reference of the high voltage power VDD and the reference voltage VRF. According to an input of an input terminal of the level shift unit 130, the level shift unit 130 may turn off the first P-channel transistor PM6 155 by applying the high voltage power VDD to the first P-channel transistor PM6 155 of the driving circuit unit 150 or may turn on the first P-channel transistor PM6 155 by lowering a gate voltage of the first P-channel transistor PM6 155. For example, the level shift unit 130 may turn off the first P-channel transistor PM6 155 by applying the high voltage power VDD to the first P-channel transistor PM6 155 of the driving circuit unit 150 according to any one input of the input terminal and may turn on the first P-channel transistor PM6 155 by lowering the gate voltage of the first P-channel transistor PM6 155 according to another complementary input.

The level shift unit 130 will be described in more detail with reference to FIGS. 2A, 2B, and/or 2C. According to an embodiment of the present invention, the level shift unit 130 may include a first inverter INV1 131, the transistor latch 130a, a fifth transistor NM1 132, and a sixth transistor NM2 133. In this case, the first inverter INV1 131 inverts an input of an input terminal thereof. The transistor latch 130a includes the third and fourth transistors PM4 and PM5 134 and 135. In this case, the third and fourth transistors PM4 and PM5 134 and 135 are each a P-channel transistor having a source electrode that is connected to the high voltage power VDD. A gate of the fourth transistor PM5 135 is connected to a drain of the third transistor PM4 134 and a gate of the third transistor PM4 134 is connected to a drain of the fourth transistor PM5 135 and a gate of the first P-channel transistor PM6 155 to constitute a latch structure. In addition, the fifth transistor NM1 132 is an N-channel transistor and is driven according to an input of an input terminal thereof. A gate voltage of the fourth transistor PM5 135 is lowered by driving the fifth transistor NM1 132. The sixth transistor NM2 133 is an N-channel transistor and is driven according to an input corresponding to an inverting output of the first inverter INV1 131. A gate voltage of the first P-channel transistor PM6 155 is lowered by driving the sixth transistor NM2 133. In addition, a gate voltage of the third transistor PM4 134 that is a P-channel transistor is lowered by driving the sixth transistor NM2 133 so as to drive the third transistor PM4 134.

The driving circuit unit 150 will be described in more detail with reference to FIGS. 1, 2A, 2B, and/or 2C. The driving circuit unit 150 includes the first P-channel transistor PM6 155 and a second transistor NM3 153. The second transistor NM3 153 is driven complementarily to the first P-channel transistor PM6 155. A gate voltage of an output transistor is lowered by driving the second transistor NM3 153 complementarily to the first P-channel transistor PM6 155 to drive the output transistor. In this case, as an example, the output transistor may be the P-channel output transistor T1 30. Furthermore, as a detailed example, the output transistor may be a P-channel MOSFET or a P-channel lateral double diffused metal oxide semiconductor (LDMOS transistor. In this case, the P-channel output transistor T1 30 is driven by driving of the second transistor NM3 153 of the driving circuit unit 150 to output high voltage power.

The driving circuit unit 150 will be described in more detail with reference to FIGS. 2A, 2B, and/or 2C.

According to another embodiment of the present invention, the driving circuit unit 150 includes a second inverter INV2 151, the first P-channel transistor PM6 155, and the second transistor NM3 153. In this case, the second inverter INV2 151 receives and inverses an output of the first inverter INV1 131 of the level shift unit 130. In addition, the first P-channel transistor PM6 155 is a P-channel transistor and is driven by driving the sixth transistor NM2 133 of the Level shift unit 130 to lower gate voltage of the first P-channel transistor PM6 155. The first P-channel transistor PM6 155 applies high voltage power source connected to a source electrode to a gate of the output transistor to turn off the output transistor by driving the first P-channel transistor PM6 155. The first P-channel transistor PM6 155 is driven according to a control of the level shift unit 130 to apply high voltage power to the gate of the output transistor. That is, the first P-channel transistor PM6 155 receives an output of the level shift unit 130 and is connected to the gate of the P-channel output transistor T1 to turn off the P-channel output transistor T1 30. The second transistor NM3 153 is an N-channel transistor and receives an output of the second inverter INV2 151 so as to be driven complementarily to the first P-channel transistor PM6 155. In this case, the second transistor NM3 153 pulls the gate voltage of the output transistor down to a low voltage power source to lower the gate voltage by driving of the second transistor NM3 153. That is, the second transistor NM3 153 that is an N-channel transistor provides a path for discharging source-gate capacitance of the P-channel output transistor T1 30 to low voltage power VSS and turns on the P-channel output transistor T1 30.

The withstand voltage protecting unit 170 will be described in detail with reference to FIGS. 1, 2A, 2B, and/or 2C. The withstand voltage protecting unit 170 includes a first withstand voltage protecting unit 171 and a second withstand voltage protecting unit 173. The first withstand voltage protecting unit 171 is driven by receiving a reference voltage generated from the reference voltage generating unit 110. In this case, the first withstand voltage protecting unit 171 protects a transistor of the transistor latch 130a and the first P-channel transistor PM6 155 for stable operations thereof. As an example, the first withstand voltage protecting unit 171 includes a P-channel transistor, for example, a PMOS transistor for protecting the source-gate breakdown voltage BVsg of a PMOS transistor connected to the high voltage power VDD, for example, the third and fourth transistors PM4 and PM5 134 and 135, and the first P-channel transistor PM6 155, and is connected between a P-channel transistor of the transistor latch 130a of the level shift unit 130 and the fifth and sixth transistors NM1 and NM2 132 and 133 that are each an N-channel transistor. The second withstand voltage protecting unit 173 is connected between a gate of the P-channel output transistor T1 30 and a drain of the second transistor NM3 153 as an N-channel transistor, for example, an NMOS transistor for turning on the output transistor T1 30 in order to protect the source-gate breakdown voltage BVsg of the output transistor T1 30.

In detail, referring to FIGS. 2A, 2B, and/or 2C, according to an embodiment of the present invention, the first withstand voltage protecting unit 171 includes a seventh transistor PM1 171a and an eighth transistor PM2 171b. In this case, the seventh transistor PM1 171a is a P-channel transistor. The seventh transistor PM1 171a is driven by receiving a reference voltage so as to pull a current down to the fifth transistor NM1 132 connected to a drain electrode so as to lower a gate voltage of the fourth transistor PM5 135 connected to a source electrode. In addition, the eighth transistor PM2 171b is a P-channel transistor. The eighth transistor PM2 171b is driven by receiving a reference voltage so as to pull a current down to the sixth transistor NM2 133 connected to a drain electrode so as to lower a gate voltage of first and third transistors connected to a source electrode.

The second withstand voltage protecting unit 173 will be described. The second withstand voltage protecting unit 173 protects the first P-channel transistor PM6 155 and the output transistor for stable operations thereof.

In detail, referring to FIGS. 2A, 2B, and/or 2C, according to an embodiment of the present invention, the second withstand voltage protecting unit 173 includes a ninth P-channel transistor 173. The ninth P-channel transistor 173 is driven by receiving a reference voltage. In addition, the ninth P-channel transistor 173 pulls a current down to the second transistor NM3 153 connected to a drain electrode so as to lower a gate voltage of the output transistor connected to a source electrode.

An operation of a circuit according to an embodiment of the present invention will be described in detail with reference to FIGS. 2A, 2B and/or 2C.

First, an input signal IN of an input terminal has a signal value satisfying 'low=0 V, and high=5 V'. When IN=0V, the fifth transistor NM1 132 is turned off and an output value of the first inverter INV1 131 is 5 V to turn on the sixth transistor NM2 133. When the sixth transistor NM2 133 is turned on, a gate voltage of the third transistor PM4 134 is lowered to turn on the third transistor PM4 134 and a gate voltage of the fourth transistor PM5 135 is increased to turn off the fourth transistor PM5 135. In addition, when the sixth transistor NM2 133 is turned on, a gate voltage of the first P-channel transistor PM6 155 of the driving circuit unit 150 is lowered to turn on the first P-channel transistor PM6 155. In this case, the first P-channel transistor PM6 155 increases a gate voltage of the output transistor T1 30 up to the high voltage power VDD to turn off the output transistor T1 30.

On the other hand, when the input signal IN of the input terminal satisfies IN=5 V, since the fifth transistor NM1 132 is turned on and an output of the first inverter INV1 131 is 0 V, the sixth transistor NM2 133 is turned off. When the fifth transistor NM1 132 is turned on, a gate voltage of the fourth transistor PM5 135 is lowered to turn on the fourth transistor PM5 135, and a gate voltage of the third transistor PM4 134 and a gate voltage of the first P-channel transistor PM6 155 of the driving circuit unit 150 are increased up to the high voltage power VDD to turn off the third transistor PM4 134 and the first P-channel transistor PM6 155. In this case, since an output of the first inverter INV1 131 is 0 V, an output of the second inverter INV2 151 of the driving circuit unit 150 is 5 V to turn on the second transistor NM3 153 of the driving circuit unit 150. When the second transistor NM3 153 is turned on, a gate voltage of the P-channel output transistor T1 30 is lowered to turn on the P-channel output transistor T1 30 to transfer power of the high voltage power VDD to an output terminal OUT. In this case, in FIGS. 2A, 2B, and/or 2C, an N-channel output transistor T2 40 performs an opposite operation to the P-channel output transistor T1 30 on the input signal IN through a multilevel inverter. That is, when the P-channel output transistor T1 30 is turned off, the N-channel output transistor T2 40 is turned on. When the P-channel output transistor T1 30 is turned on, the N-channel output transistor T2 40 is turned off.

In this case, the seventh through ninth transistors PM1, PM2, and PM3 171a, 171b, and 173 included in the withstand voltage protecting unit 170 may protect the third and fourth transistors PM4 and PM5 134 and 135 of the transistor latch 130a connected to the high voltage power VDD, the first P-channel transistor PM6 155 of the driving circuit unit 150, and the P-channel output transistor T1 30 for stable operations within a stable source-gate voltage range. In this case, the third and fourth transistors PM4 and PM5 134 and 135 of the transistor latch 130a, the first P-channel transistor PM6 155 of the driving circuit unit 150, and the P-channel output transistor T1 30 may each have a maximum source-gate voltage as follows.

$$Vsg,pm4 = VDD - VRF - Vth,pm2$$

$$Vsg,pm5 = VDD - VRF - Vth,pm1$$

$$Vsg,pm6 = VDD - VRF - Vth,pm2$$

$$Vsg,T1 = VDD - VRF - Vth,pm3$$

Vsg,pm4 is a source-gate voltage of the third transistor PM4 134, Vsg,pm5 is a source-gate voltage of the fourth transistor PM5 135, Vsg,pm6 is a source-gate voltage of the first P-channel transistor PM6 155, Vsg,T1 is a source-gate voltage of the P-channel output transistor T1 30, VDD is a voltage of high voltage power, VRF is a reference voltage, Vth,pm2 is a threshold voltage of the eighth transistor PM2 171b, Vth,pm1 is a threshold voltage of the seventh transistor PM1 171a, Vth,pm2 is a threshold voltage of the eighth transistor PM2 171b, and Vth,pm3 is a threshold voltage of the ninth P-channel transistor PM3 173.

Each of these maximum source-gate voltages is smaller than 'VDD−VRF' by Vth. 'VDD−VRF' is set as being smaller than a source-gate breakdown voltage BVsg of the third and fourth transistors PM4 and PM5 134 and 135, the first P-channel transistor PM6 155, and the P-channel output transistor T1 30, which are PMOS transistors, and as falling within a range of a recommended operating source-gate voltage. Thus, when the third and fourth transistors PM4 and PM5 134 and 135, the first P-channel transistor PM6 155, and the P-channel output transistor T1 30, which are PMOS transistors, perform a switching operation, a stable operation range may be obtained without incurring stress between a source and a gate.

In this case, when the first P-channel transistor PM6 155 and the second transistor NM3 153 of the driving circuit unit 150 operate, since the P-channel output transistor T1 30 is turned on/off by a large saturation current, the first P-channel transistor PM6 155 and the second transistor NM3 153 of the driving circuit unit 150 may easily operate at a high frequency. When the P-channel output transistor T1 30 performs a switching operation, if the P-channel output transistor T1 30 is maintained to an on or off state, an amount of current consumed except for a current for charging and discharging a gate-source capacitance of the P-channel output transistor T1 30 does not flow, thereby easily performing a low power consumption design.

A simulation result according to an embodiment of the present invention will be described with reference to FIG. 3.

FIG. 3 shows a waveform of a simulation result of a circuit of FIG. 2A, according to an embodiment of the present invention.

The simulation is performed on a circuit to which a high voltage power VDD=20 V is applied and which is configured such that a recommended operating voltage of a PMOS transistor, that is, the third and fourth transistors PM4 and PM5 134 and 135, and the first P-channel transistor PM6 155 satisfies a source-gate voltage Vsg≤12V, and a source-drain voltage Vsd≤8V, and a recommended operating voltage of a P-channel LDMOS, that is, the P-channel output transistor T1 30 satisfies a source-gate voltage Vsg≤5V and a source-drain voltage Vsd≤50V.

A waveform /VDD indicates a high voltage power waveform, a waveform /VRF1 indicates a reference voltage waveform, a waveform /IN is an input signal, a waveform /vg4_vg6 is a waveform of a gate voltage of the third transistor PM4 134 and a gate voltage of the first P-channel transistor PM6 155, a waveform /vg5 indicates a waveform of a gate voltage of the fourth transistor PM5 135, and a waveform /vg_T1 indicates a gate voltage of the P-channel output transistor T1 30.

Referring to FIG. 3, it is confirmed that a recommended operating source-gate voltage of the third and fourth transistors PM4 and PM5 134 and 135, the first P-channel transistor PM6 155, and the P-channel output transistor T1 30, which are connected to the high voltage power VDD, is smaller than the high voltage power VDD=20 V.

In addition, when a reference voltage VRF=14.17 V, a difference between the high voltage power VDD and the reference voltage VRF is 'VDD−VRF'=5.83 V. The simulation results of the third and fourth transistors PM4 and PM5 134 and 135, the first P-channel transistor PM6 155, and the P-channel output transistor T1 30 may have maximum source-gate voltages as follows.

$Vsg,pm4=vg4\_vg6=5.38V$ $Vsg,pm5=vg5=5.64V$ $Vsg,pm6=vg4\_vg6=5.38V$ $Vsg,T1=vg\_T1=4.91V$

It is confirmed that, since the maximum source-gate voltages satisfy a range of a recommended operating voltage of each PMOS transistor, the PMOS transistor may stably operate without any voltage stress.

A simulation result according to another embodiment of the present invention will be described with reference to FIG. 4. FIG. 4 shows an example obtained by using other devices instead of devices used in FIG. 3 as the third and fourth transistors PM4 and PM5 134 and 135, the first P-channel transistor PM6 155, and the P-channel output transistor T1 30 of the circuit of FIG. 2A. The simulation is performed on a circuit that is configured such that a recommended operating voltage of a P-channel LDMOS, that is, the third and fourth transistors PM4 and PM5 134 and 135, the first P-channel transistor PM6 155, and the P-channel output transistor T1 30 satisfies a source-gate voltage Vsg≤12V, and a source-drain voltage Vsd≤50V.

In this case, when a reference voltage VRF=8.676 V, a difference between the high voltage power VDD and the reference voltage VRF is 'VDD−VRF'=11.32 V. The simulation results of the third and fourth transistors PM4 and PM5 134 and 135, the first P-channel transistor PM6 155, and the P-channel output transistor T1 30 may have the maximum source-gate voltages as follows.

$Vsg,pm4=vg4\_vg6=10.75V$ $Vsg,pm5=vg5=10.79V$ $Vsg,pm6=vg4\_vg6=10.75V$ $Vsg,T1=vg\_T1=10.31V$

It is confirmed that, since the maximum source-gate voltages satisfy a range of a recommended operating voltage of each PMOS transistor, the PMOS transistor may stably operate without any voltage stress.

The simulation results of FIGS. 3 and 4 are obtained when the high voltage power VDD=20V is applied. However, although a high voltage is applied due to a recommended operating voltage of a source-drain voltage Vsd of the P-channel output transistor T1 30 and a source-drain breakdown voltage BVsd, a transistor may operate.

A transistor output circuit according to another embodiment of the present invention will be described with reference to the diagrams.

FIGS. 2A, 2B, and/or 2C are circuit diagrams of a transistor output circuit according to an embodiment of the present invention.

The transistor output circuit according to the present embodiment includes the P-channel output transistor T1 30, the N-channel output transistor T2 40, and the output driving circuit 10. In this case, the output driving circuit 10 corresponds to the output driving circuit 10 according to the above-described embodiment. Thus, the output driving circuit 10 according to the present embodiment refers to the above-described details of the output driving circuit 10, and thus, the details thereof will not be repeated herein.

Referring to FIGS. 2A, 2B, and/or 2C, the P-channel output transistor T1 30 has a source electrode connected to the high voltage power VDD and outputs the high voltage power VDD through a drain electrode according to driving of the P-channel output transistor T1 30. In this case, the output driving circuit 10 according to the above-described embodiment drives the P-channel output transistor T1 30.

The N-channel output transistor T2 40 operates complementarily to the P-channel output transistor T1 30. That is, the signal for driving the P-channel output transistor T1 30 is a driving signal $D_T$ outputted from the output driving circuit 10, the signal for driving the N-channel output transistor T2 40 is a driving signal $D_T$ outputted from the output driving circuit 10 and the driving signal $D_T$ and the driving-signal $D_T$ are in complementary relations. The N-channel output transistor T2 40 outputs power from its drain electrode connected to a drain electrode of the P-channel output transistor T1 30 to a low voltage power terminal connected to a source electrode according to driving of the N-channel output transistor T2 40. In this case, the N-channel output transistor T2 40 is driven complementarily to the output driving circuit 10 according to the above-described embodiment that drives the P-channel output transistor T1 30.

According to an embodiment of the present invention, the P-channel output transistor T1 30 is driven by driving of the second transistor NM3 153 of the driving circuit unit 150 of the output driving circuit 10 and the N-channel output transistor T2 40 is driven according to a complementary input to an input of an input terminal for driving the second transistor NM3 153.

According to an embodiment of the present invention, an output driving circuit and a transistor output circuit may include a level shift unit and may stably operate when a high voltage that is smaller than a source-drain breakdown voltage and is greater than a gate-source breakdown voltage applied to a gate of the output transistor.

In addition, according to an embodiment of the present invention, an output driving circuit and a transistor output circuit may include a level shift unit for stably operating an output transistor at a high frequency and for stably operating an output transistor at a low amount of current consumed.

It is obvious that various effects directly stated according to various exemplary embodiment of the present invention may be derived by those skilled in the art from various configurations according to the exemplary embodiments of the present invention.

The accompanying drawings and the above-mentioned exemplary embodiments have been illustratively provided in order to assist in understanding of those skilled in the art to which the present invention pertains. In addition, the exemplary embodiments according to various combinations of the aforementioned configurations may be obviously implemented by those skilled in the art from the aforementioned detailed explanations. Therefore, various exemplary embodiments of the present invention may be implemented in modified forms without departing from an essential feature of the present invention. In addition, a scope of the present invention should be interpreted according to claims and includes various modifications, alterations, and equivalences made by those skilled in the art.

What is claimed is:

1. An output driving circuit, comprising:
   a reference voltage generating unit for generating a reference voltage having a predetermined voltage difference with respect to a high voltage power source;
   a level shift unit including a latch and turning off a first transistor of a driving circuit unit by applying the high voltage power source to the first transistor according to an input signal of an input terminal or driving the first transistor by lowering a gate voltage of the first transistor according to the input signal of the input terminal;
   the driving circuit unit including the first transistor that is driven according to a control of the level shift unit to apply the high voltage power source to a gate of an output transistor that is driven by driving of the driving circuit unit and a second transistor that is driven complementarily to the first transistor to lower a gate voltage of the output transistor and drive the output transistor; and
   an withstand voltage protecting unit that is driven by receiving the reference voltage generated from the reference voltage generating unit and includes a first withstand voltage protecting unit for protecting transistors of the latch and the first transistor for stable operations thereof and a second withstand voltage protecting unit for protecting the output transistor for a stable operation thereof.

2. The output driving circuit according to claim 1, wherein the level shift unit includes:
   a first inverter for inverting the input signal of the input terminal;
   the latch including third and fourth transistors that are P-channel transistors each having a source electrode connected to the high voltage power source, a gate of the fourth transistor being connected to a drain of the third transistor and a gate of the third transistor being connected to a drain of the fourth transistor and a gate of the first transistor;
   an N-channel fifth transistor that is driven according to the input signal of the input terminal and lowers a gate voltage of the fourth transistor; and
   an N-channel sixth transistor that is driven according to an input corresponding to an inverting output of the first inverter and drives the first transistor by lowering the gate voltage of the first transistor.

3. The output driving circuit according to claim 2, wherein the driving circuit unit includes:
   a second inverter for receiving and inverting an output of the first inverter;
   the first transistor that is driven by a gate voltage's lowering according to driving of the sixth transistor and turns off the output transistor by applying the high voltage power source connected to a source electrode to the gate of the output transistor; and
   the second transistor that is driven complementarily to the first transistor by receiving an output of the second inverter and pulls the gate voltage of the output transistor down to a low voltage power source to lower the gate voltage of the output transistor,
   wherein the first transistor is a P-channel transistor and wherein the second transistor is an N-channel output transistor.

4. The output driving circuit according to claim 2, wherein the first withstand voltage protecting unit includes:
   a P-channel seventh transistor that is driven by receiving the reference voltage and pulls a gate voltage of the fourth transistor connected to a source electrode down to the fifth transistor connected to a drain electrode to lower the gate voltage of the fourth transistor; and
   a P-channel eighth transistor that is driven by receiving the reference voltage and pulls gate voltages of the first and third transistors connected to a source electrode down to the sixth transistor connected to a drain electrode to lower the gate voltages of the first and third transistors, and
   wherein the second withstand voltage protecting unit includes a P-channel ninth transistor that is driven by receiving the reference voltage and pulls the gate voltage of the output transistor connected to a source electrode down to the second transistor connected to a drain electrode to lower the gate voltage of the output transistor.

5. The output driving circuit according to claim 1, wherein the reference voltage generating unit includes a Zener diode connected to the high voltage power source.

6. The output driving circuit according to claim 1, wherein the reference voltage generating unit includes a plurality of P-channel MOSFETs that are connected in series to the high voltage power source.

7. The output driving circuit according to claim 1, wherein the reference voltage generating unit includes a plurality of N-channel MOSFETs that are connected in series to the high voltage power source.

8. The output driving circuit according to claim 1, wherein the output transistor is a P-channel MOSFET or a P-channel LDMOS transistor that is driven by driving of the second transistor of the driving circuit unit to output high voltage power.

9. The output driving circuit according to claim 2, wherein the output transistor is a P-channel MOSFET or a P-channel LDMOS transistor that is driven by driving of the second transistor of the driving circuit unit to output high voltage power.

10. The output driving circuit according to claim 3, wherein the output transistor is a P-channel MOSFET or a P-channel LDMOS transistor that is driven by driving of the second transistor of the driving circuit unit to output high voltage power.

11. The output driving circuit according to claim 4, wherein the output transistor is a P-channel MOSFET or a P-channel LDMOS transistor that is driven by driving of the second transistor of the driving circuit unit to output high voltage power.

12. A transistor output circuit, comprising:
  the output transistor according to claim 1 having a source electrode connected to the high voltage power source and outputting high voltage power through a drain electrode;
  an N-channel output transistor that operates complementarily to the output transistor and pulls power from a drain electrode connected to the drain electrode of the output transistor down to a lower voltage power source connected to a source electrode; and
  the output driving circuit according to claim 1, for driving each of the output transistor and the N-channel output transistors according to a complementary switching operation,
  wherein the output transistor is a P-channel output transistor.

13. The transistor output circuit according to claim 12, wherein the level shift unit of the output driving circuit includes:
  a first inverter for inverting the input signal of the input terminal;
  the latch including third and fourth transistors that are P-channel transistors each having a source electrode connected to the high voltage power source, a gate of the fourth transistor being connected to a drain of the third transistor and a gate of the third transistor being connected to a drain of the fourth transistor and a gate of the first transistor;
  an N-channel fifth transistor that is driven according to the input signal of the input terminal and lowers a gate voltage of the fourth transistor; and
  an N-channel sixth transistor that is driven according to an input corresponding to an inverting output of the first inverter and drives the first transistor by lowering the gate voltage of the first transistor.

14. The transistor output circuit according to claim 13, wherein the driving circuit unit of the output driving circuit includes:
  a second inverter for receiving and inverting an output of the first inverter;
  the first transistor that is driven by a gate voltage's lowering according to driving of the sixth transistor and turns off the output transistor by applying the high voltage power source connected to a source electrode to the gate of the output transistor; and
  the second transistor that is driven complementarily to the first transistor by receiving an output of the second inverter and pulls the gate voltage of the output transistor down to a low voltage power source to lower the gate voltage of the output transistor,
  wherein the first transistor is a P-channel transistor and wherein the second transistor is an N-channel output transistor.

15. The transistor output circuit according to claim 13, wherein the first withstand voltage protecting unit of the output driving circuit includes:
  a P-channel seventh transistor that is driven by receiving the reference voltage and pulls a gate voltage of the fourth transistor connected to a source electrode down to the fifth transistor connected to a drain electrode to lower the gate voltage of the fourth transistor; and
  a P-channel eighth transistor that is driven by receiving the reference voltage and pulls gate voltages of the first and third transistors connected to a source electrode down to the sixth transistor connected to a drain electrode to lower the gate voltages of the first and third transistors, and
  wherein the second withstand voltage protecting unit includes a P-channel ninth transistor that is driven by receiving the reference voltage and pulls the gate voltage of the output transistor connected to a source electrode down to the second transistor connected to a drain electrode to lower the gate voltage of the output transistor.

16. The transistor output circuit according to claim 12, wherein the P-channel output transistor is driven by driving of the second transistor, and the N-channel output transistor is driven according to a complementary input to the input signal of the input terminal for driving the second transistor.

* * * * *